United States Patent
Hsu et al.

(10) Patent No.: US 9,015,936 B2
(45) Date of Patent: Apr. 28, 2015

(54) METHOD FOR MANUFACTURING IC SUBSTRATE

(71) Applicant: Zhen Ding Technology Co., Ltd., Tayuan, Taoyuan (TW)

(72) Inventors: Che-Wei Hsu, Taoyuan (TW); Shih-Ping Hsu, Taoyuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 179 days.

(21) Appl. No.: 13/891,204

(22) Filed: May 10, 2013

(65) Prior Publication Data

US 2013/0318785 A1 Dec. 5, 2013

(30) Foreign Application Priority Data

May 31, 2012 (CN) .......... 2012 1 01752976

(51) Int. Cl.
*H01K 3/10* (2006.01)
*H05K 3/02* (2006.01)
*H05K 3/10* (2006.01)
*H05K 1/00* (2006.01)
*H05K 3/00* (2006.01)
*H05K 3/46* (2006.01)
*H01L 23/498* (2006.01)
(Continued)

(52) U.S. Cl.
CPC .............. *H05K 3/108* (2013.01); *H05K 3/0097* (2013.01); *H05K 3/427* (2013.01); *H05K 3/4602* (2013.01); *H05K 2201/09509* (2013.01); *H05K 2203/1545* (2013.01); *H01L 23/4985* (2013.01); *H01L 21/486* (2013.01); *H01L 2924/0002* (2013.01)

(58) Field of Classification Search
CPC .............. H01L 2924/01079; H05K 2201/0355; H05K 3/041; H05K 2201/10287; H05K 3/4069
USPC ............ 29/846, 847, 849, 850, 852; 174/250, 174/254

See application file for complete search history.

(56) References Cited

U.S. PATENT DOCUMENTS

| | | | |
|---|---|---|---|
| 4,696,885 A * | 9/1987 | Vijan | 430/311 |
| 4,931,148 A * | 6/1990 | Kukanskis et al. | 205/126 |
| 6,270,889 B1 * | 8/2001 | Kataoka et al. | 428/352 |

(Continued)

FOREIGN PATENT DOCUMENTS

| | | | |
|---|---|---|---|
| TW | I236317 | * | 7/2005 |
| TW | I236317 B | | 7/2005 |

(Continued)

*Primary Examiner* — David Angwin
(74) *Attorney, Agent, or Firm* — Novak Druce Connolly Bove + Quigg LLP

(57) ABSTRACT

A method for manufacturing an IC substrate includes following steps: providing a roll of double-sided flexible copper clad laminate; converting the roll of double sided flexible copper clad laminate into a roll of double sided flexible wiring board in a roll to roll manner; cutting the roll of double-sided flexible wiring board into a plurality of separate sheets of double sided flexible wiring board; forming first and second rigid insulating layers on the first and second wiring layers of each sheet of double sided flexible wiring board; forming third and fourth wiring layers on the first and second rigid insulating layers, and electrically connecting the first and third wiring layers, and electrically connecting the fourth and second wiring layers, thereby obtaining a sheet of substrate having a plurality of IC substrate units; and cutting the sheet of substrate into separate IC substrate units.

13 Claims, 11 Drawing Sheets

(51) Int. Cl.
*H01L 21/48* (2006.01)
*H05K 3/42* (2006.01)

(56) References Cited

U.S. PATENT DOCUMENTS

| | | | |
|---|---|---|---|
| 7,780,836 B2* | 8/2010 | Chinda et al. | 205/125 |
| 2004/0124003 A1* | 7/2004 | Ryu et al. | 174/254 |
| 2005/0029014 A1* | 2/2005 | Miura | 174/262 |
| 2005/0218480 A1* | 10/2005 | Usui et al. | 257/632 |
| 2013/0062102 A1* | 3/2013 | Lee et al. | 174/254 |

FOREIGN PATENT DOCUMENTS

| | | | |
|---|---|---|---|
| TW | 200819019 A | | 4/2008 |
| TW | 2008191019 | * | 4/2008 |
| TW | I298608 B | | 7/2008 |
| TW | 201110842 A | | 3/2011 |
| TW | 201132263 A | | 9/2011 |

* cited by examiner

METHOD FOR MANUFACTURING IC SUBSTRATE

BACKGROUND

1. Technical Field

The present disclosure relates to technology of manufacturing printed circuit boards (PCBs), and particularly to a method for manufacturing a IC substrate.

2. Description of Related Art

In current, there are two main IC substrate types: one having a core and the other one without a core (i.e. coreless one). However, an IC substrate having a core is thicker, and an IC substrate without a core is easy to be warped because of lacking a rigid support.

A normal method for manufacturing an IC substrate includes the following steps: taking a rigid copper clad laminate (e.g. fiberglass resin) as a core and forming a first inner wiring layer and a second inner wiring layer; machine drilling, plating through hole, and filling material in the plating through hole and so on, such that the first inner wiring layer is electrically connected to the second inner wiring layer; laminating a adhesive sheet and a copper foil onto the core to build the core up, thereby forming a build up wiring. With a development of technology, a thick of the core reaches to 100 micrometers. However, under the method for manufacturing the IC substrate described above, it is impossible to make the IC substrate thinner, and it is convenient to use the IC substrate to a semiconductor package. Another method for manufacturing a IC substrate includes the following steps: instead of using a copper clad laminate as a core, using a adhesive sheet and a copper foil to manufacturing a build up wiring, forming a conductive via in the adhesive sheet, and forming a wiring layer on the adhesive sheet, the wiring layer being electrically connected to the conductive via; and repeating the above steps in the above method for manufacturing the IC substrate. The method without using the copper clad laminate as a core can reduce the thickness of the IC substrate. However, this method is a single-sided build up method, and a IC substrate wrap is easy to occur. A plurality of IC substrate is thus scraped.

What is needed therefore is a method for manufacturing a multilayer printed circuit board to overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Embodiments will be described with reference to the drawings.

A method of manufacturing a IC substrate according to an exemplary embodiment includes the steps as follows.

Figure 1:
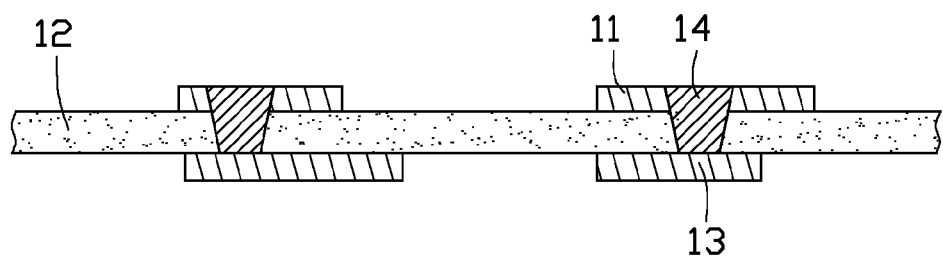
FIG. 1 is a schematic, cross-sectional view of a sheet of a double-sided flexible wiring board according to an exemplary first embodiment, the sheet of the double-sided flexible wiring board including a first wiring layer, a flexible insulating layer, and a second wiring layer, which are stacked in the above described order.

FIG. 1 shows step 1, in which a sheet of a double-sided flexible wiring board 10 is provided. In the present embodiment, the sheet of the double-sided flexible wiring board 10c includes a first wiring layer 11, a flexible insulating layer 12 and a second wiring layer 13, which are arranged in the above described order. That is, the flexible insulating layer 12 is sandwiched between the first wiring layer 11 and the second wiring layer 13. The first wiring layer 11 is electrically connected to the second wiring layer 13 through at least one conductive via 14 arranged in the flexible insulating layer 12.

Figure 2:
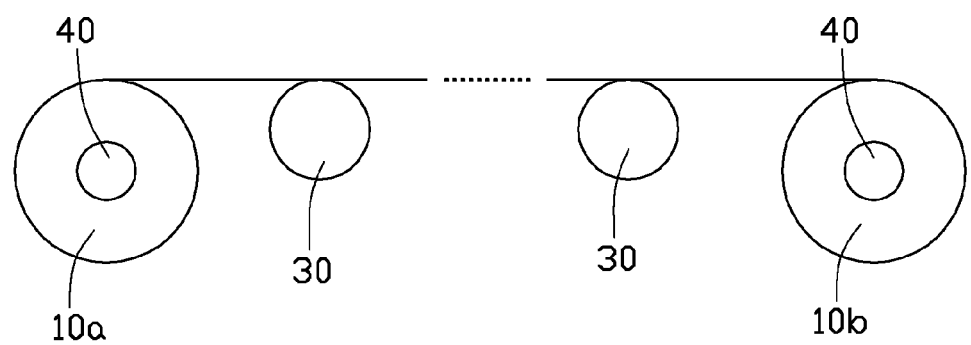
FIG. 2 is a schematic view of a roll to roll manner for manufacturing a roll of a double-sided flexible wiring board for manufacturing the sheet of the double-sided flexible wiring board of FIG. 1.

The sheet of the double-sided flexible wiring board 10c is obtained by cutting a roll of a double-sided flexible wiring board 10b. FIG. 2 shows a roll to roll manner for manufacturing the roll of a double-sided flexible wiring board 10c. That is, a roll of a double-sided flexible copper clad laminate 10a is processed in a roll-to-roll manner to obtain the roll of a double-sided flexible wiring board 10b. In detail, the roll of double-sided flexible copper clad laminate 10a is mounted between the two rollers 40. That is, the unprocessed roll of double-sided flexible copper clad laminate 10a is wound from one roller 40, and the roll of double-sided flexible copper clad laminate 10a which is processed (i.e. the roll of double-sided flexible wiring board 10b) is wound onto the other one roller 40. For example, one roller 40 is a feeding roll for unwinding the roll of unprocessed double-sided flexible copper clad laminate 10a, and the other one roller 40 is a receiving roll onto which the roll of processed double-sided flexible copper clad laminate 10a is wound. When the rotating feeding roller moves the roll of double-sided flexible copper clad laminate 10a towards the receiving roller, a processing device 30 between the rollers 40 processes the roll of double-sided flexible copper clad laminate 10a, for example, by drilling and by pattern manufacturing. The roll-to-roll manner improves manufacturing efficiency. The method for manufacturing the flexible circuit board 10c includes the following steps.

Figure 3:
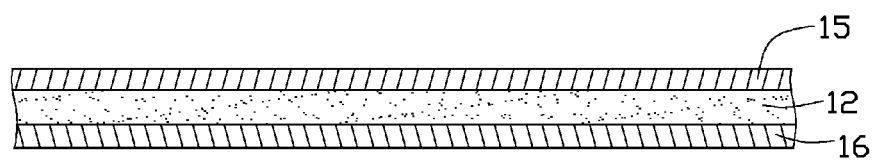
FIG. 3 is a schematic, cross-sectional view of a roll of a double-sided flexible copper clad laminate for manufacturing the roll of double-sided flexible wiring board of FIG. 2.

First, as FIGS. 2 and 3 show, the roll of double-sided flexible copper clad laminate 10a is provided. The roll of double-sided flexible copper clad laminate 10a includes a flexible insulating layer 12, a first copper layer 15, and a second copper layer 16. The first copper layer 15 and the second copper layer 16 are adhered to two opposite sides of the flexible insulating layer 12.

A material of the flexible insulating layer 12 may be a flexible material, for example, Polyimide, Polyethylene Naphthalate, or Polyethylene Terephthalate. In the present embodiment, a material of flexible insulating layer 12 is Polyimide. The thickness of the flexible insulating layer 12 is in a range from 15 micrometers to 100 micrometers, such that a better mechanical strength and a thinner thickness can be simultaneously satisfied. Each of the first copper foil 15 and the second copper foil 16 may be a roll of copper foil, or an electrolytic foil, for example. In the present embodiment, each of the first copper foil 15 and the second copper foil 16 is a roll of copper foil. A thickness of each of the first copper foil 15 and the second copper foil 16 is in a range from about 12 micrometers to about 20 micrometers.

Figure 4:
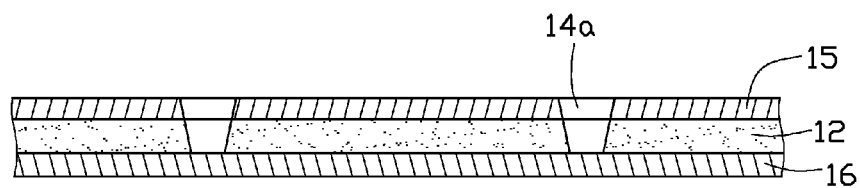
FIG. 4 shows a plurality of first blind vias defined in the roll of double-sided flexible copper clad laminate of FIG. 3.
Figure 5:
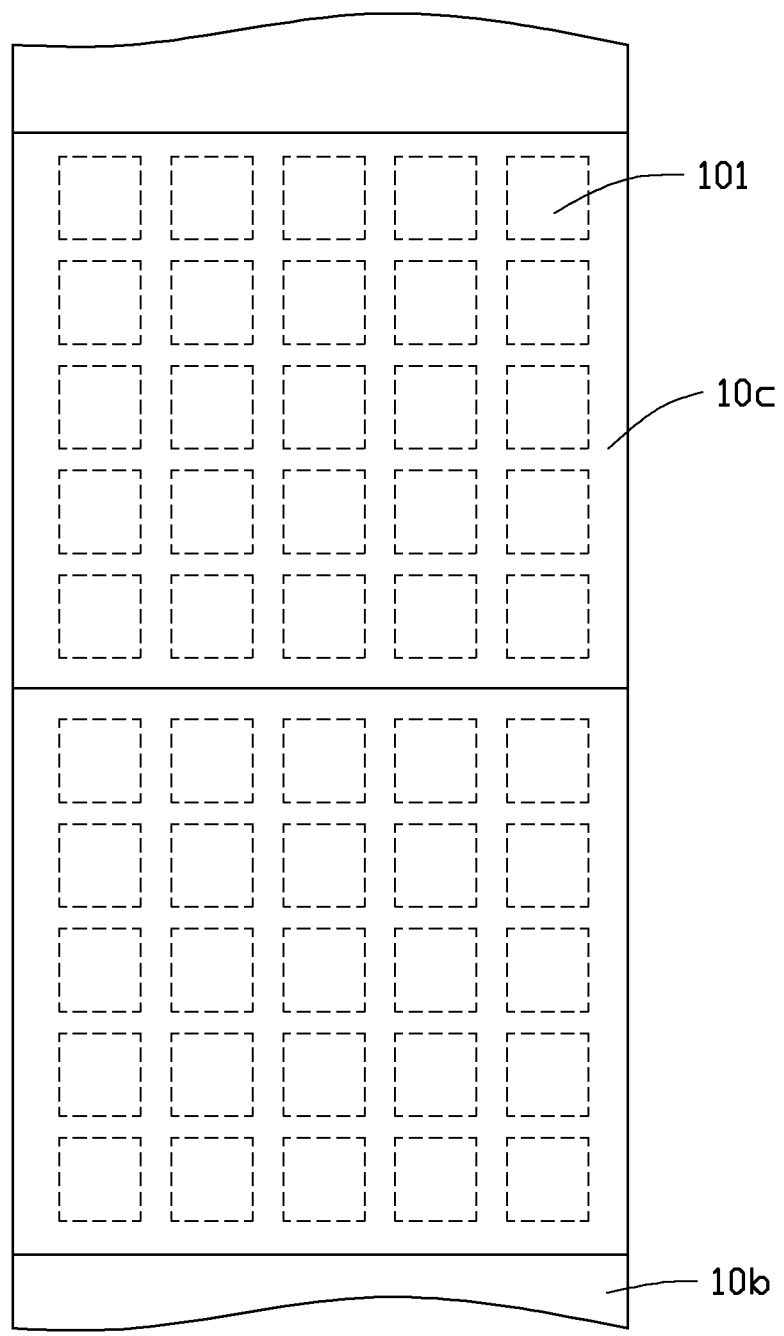
FIG. 5 is a schematic, cross-sectional view of cutting the roll of double-sided flexible wiring board into a plurality of sheets of the double-sided flexible wiring board of FIG. 1.

Second, as FIG. 4 shows, a plurality of first blind vias 14a are defined in the roll of double-sided flexible copper clad laminate 10a in a roll to roll manner. Each first blind via 14a passes through the first copper foil layer 15 and the flexible insulating layer 12. The blind via 14a may be formed by laser ablation or by a blanking die. In the present embodiment, the first blind vias 14a are formed by laser ablation. After laser ablation, a desmear process (e.g. plasma treatment) is applied to the first blind vias 14a to remove a residue in the first blind vias 14a.

Second, as FIGS. 4 and 1 show, each first blind via 14a is filled with an electrically conductive material, thereby forming a plurality of conductive vias 14 connecting the first copper foil layer 15 and the second copper foil layer 16. The electrically conductive material may be copper, sliver, gold, or tin, for example. In the present embodiment, the electrically conductive material is copper, and each blind via 14a is filled by an electroplating process. In other embodiments, each blind via 14a may be filled by filling electrically conductive paste, and then the electrically conductive paste in each blind via 14a is solidified to electrically connect the first copper foil 15 and the second copper foil 16.

Third, as FIGS. 4 and 1 show, the first copper foil layer 15 is converted into a first wiring layers 11, and the second copper foil layer 16 is converted into a second wiring layer 13, thereby obtaining the roll of double sided flexible wiring board 10b. The first wiring layer 11 spatially corresponds to the second wiring layer 13. The first wiring layer 11 is electrically connected to the second wiring layer 13 through at least one conductive via 14, such that the roll of double sided flexible wiring board 10b is obtained. In the present embodiment, the first copper foil layer 15 is converted into the first wiring layer 11 by an image transfer process and an etching process; the second copper foil layer 16 is converted into the second wiring layer 13 by an image transfer process and an etching process.

In alternative embodiments, a plurality of through holes may be firstly defined in the roll of double sided flexible copper clad laminate 10a; each through hole is electroplated, or each through hole is filled with an electrically conductive material, such that the first copper foil layer 15 is electrically connected to the second copper foil layer 16; finally, the first copper foil layer 15 is converted into the first wiring layer 11, and the second copper foil layer 16 is converted into the second wiring layer 13.

It is understood that the above steps are processed in a roll to roll manner.

Finally, the roll of double sided flexible circuit board 10b is separated into a plurality of sheets of the double sided flexile wiring board 10c. In detail, each two adjacent wiring board units are actually separated from each other by a laser beam or by a milling cutter along the edges between the two adjacent wiring board units to obtain the plurality of separate sheets of the double sided flexile wiring board 10c. Each of the sheets of the double sided flexile wiring board 10c includes the first wiring layer 11, the flexible insulating layer 12, and the second wiring layer 13.

Figure 6:
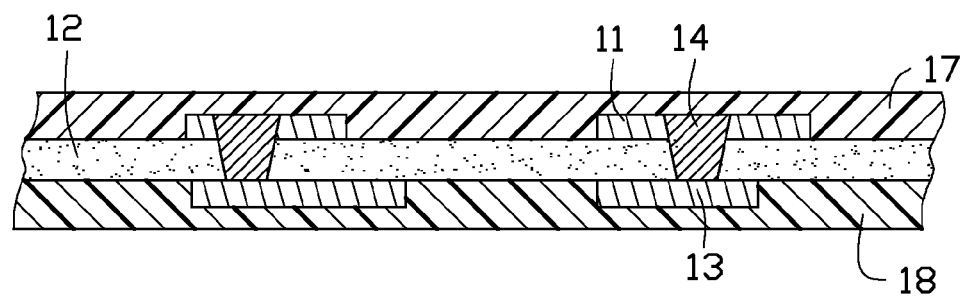
FIG. 6 shows a first rigid insulating layer and a second rigid insulating layer formed on two opposite sides of the sheet of the double sided flexible wiring board of FIG. 1.

FIG. 6 shows step 2, in which two rigid insulating layers are respectively stacked on the first wiring layer 11 and the second wiring layer 13 of the sheet of the double sided flexible wiring board 10c, and laminated the two rigid insulating layers and the sheet of the double sided flexible wiring board 10c to form a first rigid insulating layer 17 on the first wiring layer 11 and a second rigid insulating layer 18 on the second wiring layer 13. A material of the rigid insulating layer is a normal insulating material, for example. Pre-preg, Ajinomoto build-up film. In the present embodiment, Ajinomoto build-up film is used to be the rigid insulating layer. The Ajinomoto build-up film has a lower thermal expansion coefficient, a lower Yang's modulus, a higher glass transition temperature, and a thinner thickness, which are the main reasons for using it. Accordingly, it is easy to form fine and very thin traces on a surface of the Ajinomoto build-up film.

Figure 7:
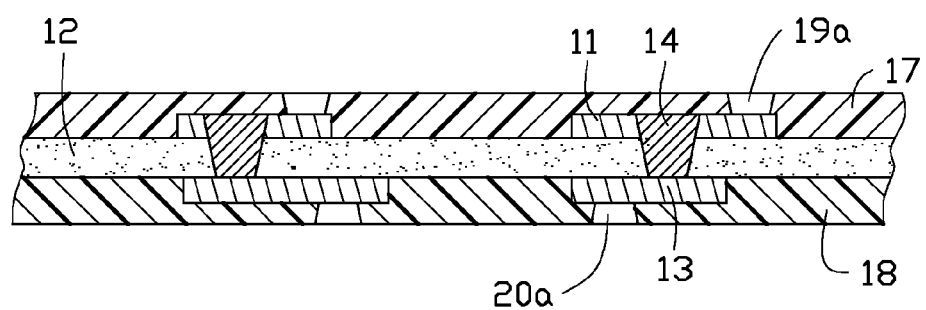
FIG. 7 shows a second blind via defined in the first rigid insulating layer of FIG. 6, and a third blind via defined in the second rigid insulating layer of FIG. 6.

FIG. 7 shows step 3, in which at least one second blind via 19a is defined in the first insulating layer 17 by laser ablation, and at least one third blind via 20a is defined in the second insulating layer 18 by laser ablation. The at least one third blind via 19a passes through the first insulating layer 17, and exposes portions of the first wiring layer 11. The at least one third blind via 20a passes through the second insulating layer 17, and exposes portions of the second wiring layer 13. After laser ablation, a desmear process (e.g. plasma treatment) is applied to each of the second blind via 19a and the third blind via 20a to remove a residue in each of the second blind via 19a and the third blind via 20a.

Figure 8:
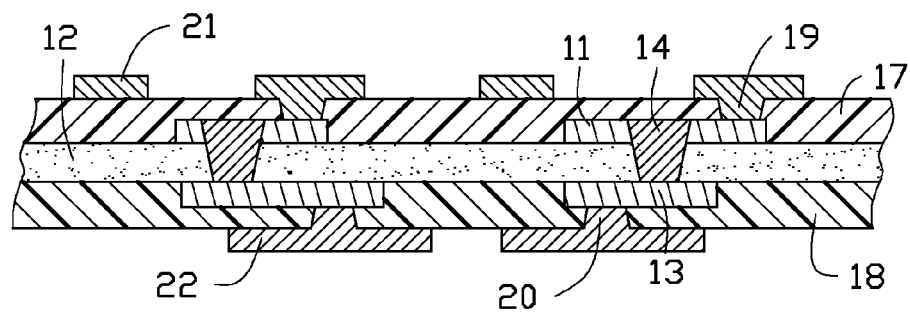
FIG. 8 shows a third wiring layer formed on the first rigid insulating layer of FIG. 7, and a fourth wiring layer formed on the second rigid insulating layer of FIG. 7.
Figure 9:
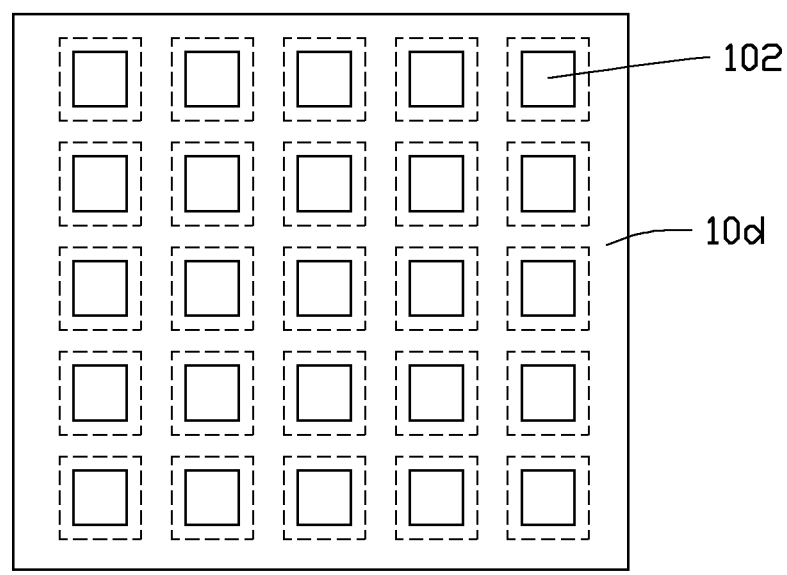
FIG. 9 is a schematic, cross-sectional view of a sheet of a substrate having a plurality of IC substrate units.

FIG. 8 shows step 4, in which the second blind via 19a and the third blind via 20a are filled with an electrically conductive material to form the second conductive hole 19 and the third conductive hole 20, and then a third wiring layer 21 and a fourth wiring layer 22 are respectively formed on the first insulating layer 17 and the second insulating layer 18. As such, the second conductive hole 19 electrically connects the third wiring layer 21 to the first wiring layer 11, and the third conductive hole 20 electrically connects the fourth wiring layer 22 to the second wiring layer 13. As such, a sheet substrate 10d having a plurality of IC substrate units 102 is obtained (see FIG. 9).

In the present embodiment, the third wiring layer 21 and the fourth wiring layer 22 are formed by a Semi-addition process. In alternative embodiments, the third wiring layer 21 and the fourth wiring layer 22 may be formed by a full addition process. In further alternative embodiments, a copper layer having a predetermined thickness is formed on the whole surface of the first rigid insulating layer 17 by electroplating, electro-less plating, sputtering, etc, and the first wiring layer 11 is obtained by using a subtractive process.

Figure 10:
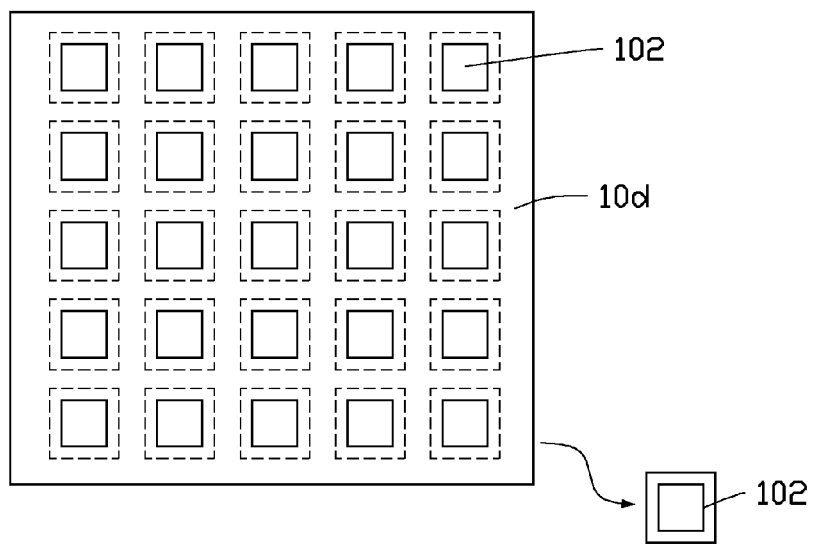
FIG. 10 is a schematic, cross-sectional view of cutting the sheet of the substrate of FIG. 9 into the plurality of IC substrate units.

FIG. 10 shows step 5, the sheet of substrate 10d is separated into a plurality of separate IC substrate units 102. In the present embodiment, each IC substrate unit 102 is an IC substrate.

Figure 11:
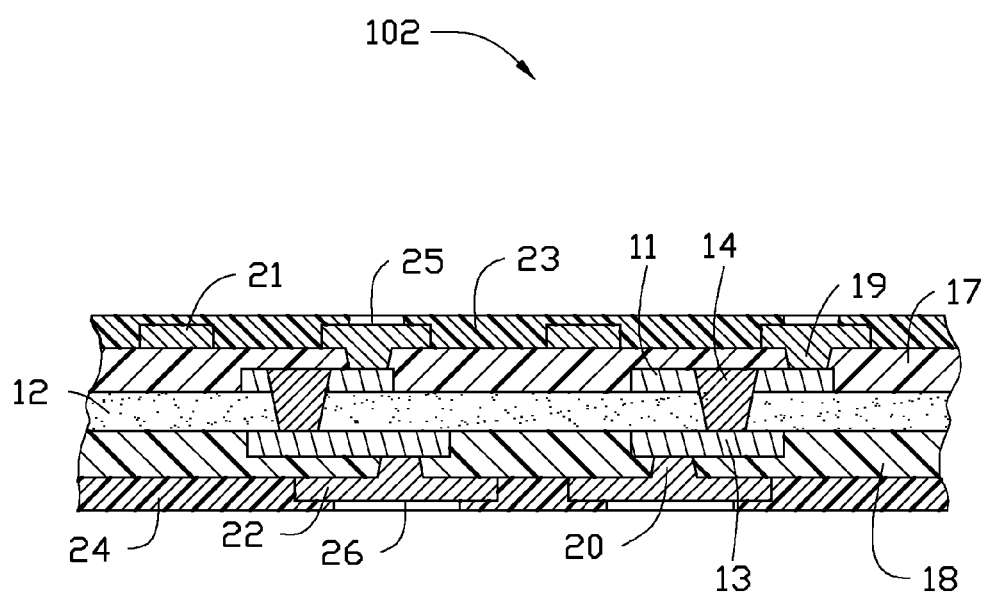
FIG. 11 shows a first solder mask formed on the third wiring layer of FIG. 10, and a second solder mask formed on the fourth wiring layer of FIG. 10.

In the present embodiment, after step 4, the method also includes a step of forming a first solder mask on the third wiring layer 21 and gaps defined between the third wiring layer 21, and forming a second solder mask on the fourth wiring layer 22 and gaps defined between the fourth wiring layer 22. Referring to FIG. 11, a first solder mask 23 is formed on the third wiring layer 21 and gaps defined between the third wiring layer 21, and a plurality of openings is defined in the first solder mask 23 to define copper surfaces exposed from the openings as contact pads 25; a second solder mask 24 is formed on the fourth wiring layer 22 and gaps defined between the fourth wiring layer 22, and a plurality of openings is defined in the second solder mask 24 to define copper surfaces exposed from the openings as soldering pads 26.

In the present embodiment, the first solder mask 23 is made of liquid photo-imageable solder resist ink. The method for forming the first solder mask 23 includes the following steps: first, printing the liquid photo-imageable solder resist ink on the surface of third wiring layer 21 and gaps defined between the third wiring layer 21; second, procuring the liquid photo-imageable solder resist ink to make the surface of the liquid photo-imageable solder resist ink be procured; third, selectively exposing the liquid photo-imageable solder resist ink by ultraviolet light to make a part of the liquid photo-imageable solder resist ink generate a cross-linking reaction; removing the other part of the liquid photo-imageable solder resist ink which have not generated a cross-linking reaction from the third wiring layer 21 by a developing process; finally, thermally curing the remaining liquid photo-imageable solder resist ink, thereby forming the first solder mask 23. A method of forming the second solder mask 24 is similar to the method of forming the first solder mask 23. There may be one contact pad 25, or any number of contact pads 25. There may be one soldering pad 26, or any number of soldering pads 26. In the present embodiment, there are two contact pads 25 and two soldering pads 26 shown in the FIG. 11.

In other embodiments, the first solder mask 23 may be made of a thermosetting ink. In such case, the exposing and developing can be omitted, the thermosetting ink is printed on a part of the third wiring layer 21 and in the gaps defined between the third wiring layer 21 using a patterned screen, and the contact pads 25 are left unprinted by, and covered by, the patterned screen. Then, the thermosetting ink is cured to obtain the first solder mask 23.

When a fifth or more layer IC substrate is manufactured, it is only necessary to add another layer after step 6, like steps 4 to 6.

The IC substrate may supports semiconductor chips, and the semiconductor chip is electrically connected to the contact pads 25 by electrically conductive member. The soldering pads 26 are electrically connected to a print circuit board by electrically conductive members, such that the semiconductor chips are electrically connected to the printed circuit board.

It is understood that each of the IC substrate units 102 may be a unit having a plurality of IC substrates. In such case, the method further includes a step of separating the IC substrate unit 102 into the plurality of IC substrates.

A material of core of the IC substrate is flexible material, and a thickness of the IC substrate is thus thinner.

While certain embodiments have been described and exemplified above, various other embodiments will be apparent from the foregoing disclosure to those skilled in the art. The disclosure is not limited to the particular embodiments described and exemplified but is capable of considerable variation and modification without departure from the scope and spirit of the appended claims.

What is claimed is:

1. A method for manufacturing an IC substrate, comprising:
   providing a roll of double-sided flexible copper clad laminate, the roll of double-sided flexible copper clad laminate comprising a first copper layer, a flexible insulating layer, and a second copper layer, the flexible insulating layer being sandwiched between the first and second copper layers;
   forming a plurality of conductive vias, patterning the first copper layer to form a first wiring layers, and patterning the second copper layer to form a second wiring layers in a roll to roll manner, the first wiring layer being electrically connected to the second wiring layer by at least one conductive via, thereby converting the roll of double-sided flexible copper clad laminate into a roll of double-sided flexible wiring board;
   cutting the roll of double-sided flexible wiring board into a plurality of separate sheets of double sided flexible wiring board, each of the sheet of double sided flexible wiring board comprising a plurality of wiring board units, each wiring board unit comprising the first wiring layer, the flexible insulating layer, and a second wiring layer;
   forming a first rigid insulating layer on the first wiring layer of each sheet of double sided flexible wiring board by lamination, and forming a second rigid insulating layer on the second wiring layer of each sheet of double sided flexible wiring board by lamination;
   forming a third wiring layer on the first rigid insulating layer, and electrically connecting the first wiring layer and the third wiring layer, forming a fourth wiring layer on the second rigid insulating layer, and electrically connecting the fourth wiring layer and the second wiring layer, thereby obtaining a sheet of substrate having a plurality of IC substrate units; and
   cutting the sheet of substrate into separate IC substrate units.

2. The method of claim 1, wherein forming a plurality of conductive vias in a roll to roll manner comprises:
   forming a plurality of first blind vias in the roll of double sided flexible copper clad laminate, each of first blind vias passing through the first copper layer and the flexible insulating layer; and
   filling each first blind via with an electrically conductive material, thereby forming the conductive vias.

3. The method of claim 2, wherein each first blind via is filled with an electrically conductive material by electroplating.

4. The method of claim 2, wherein the plurality of first blind vias are defined in the roll of double sided flexible copper clad laminate by laser ablation.

5. The method of claim 4, wherein after laser ablation, the method further comprises a step of applying a desmear process to each of the first blind vias.

6. The method of claim 1, wherein forming a plurality of conductive vias in a roll to roll manner comprises:
   forming a plurality of through holes in the roll of double sided flexible copper clad laminate, each of through holes passing through the first copper layer, the flexible insulating layer, and the second copper layer; and
   filling each through hole with an electrically conductive material, thereby forming the conductive vias.

7. The method of claim 6, wherein each first blind via is filled with an electrically conductive material by electroplating.

8. The method of claim 6, wherein the plurality of through holes are defined in the roll of double sided flexible copper clad laminate by laser ablation.

9. The method of claim 8, wherein after laser ablation, the method further comprises a step of applying a desmear process to each of the through holes.

10. The method of claim 1, wherein after forming the third wiring layer and the fourth wiring layer, the method further comprises a step of forming a first solder mask on the third wiring layer and gaps defined between the third wiring layer, forming a second solder mask on the fourth wiring layer and gaps defined between the fourth wiring layer, and defining a plurality of openings in the first solder mask and the second solder mask, thereby defining copper surfaces exposed from the openings defined in the first solder mask as contact pads, and defining copper surfaces exposed from the opening defined in the second solder mask as soldering pads.

11. The method of claim 8, wherein the third wiring layer is formed by a semi-additive process.

12. The method of claim 8, wherein the third wiring layer and the fourth wiring layer are formed by a semi-additive process.

13. The method of claim 1, wherein the step of forming a third wiring layer on the first rigid insulating layer, and electrically connecting the first wiring layer and the first wiring layer comprising:

defining at least one second blind via in the first rigid insulating layer, the at least one second blind via passing through the first rigid insulating layer, and exposing a part of the third wiring layer; and filling the at least one second blind via with an electrically conductive material, and forming the third wiring layer on the first rigid insulating layer, the electrically conductive material in the at least one second blind via electrically connecting the first wiring layer to the third wiring layer.

* * * * *